(12) United States Patent
Kim

(10) Patent No.: US 6,226,218 B1
(45) Date of Patent: May 1, 2001

(54) ROW DECODER DRIVER FOR SEMICONDUCTOR MEMORY DEVICE

(75) Inventor: Keum-Yong Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/439,299

(22) Filed: Nov. 12, 1999

(30) Foreign Application Priority Data

Apr. 23, 1999 (KR) .................................................. 99-14624

(51) Int. Cl.$^7$ ....................................................... G11C 8/00
(52) U.S. Cl. ........................ 365/230.06; 365/51; 365/63
(58) Field of Search ................................ 365/230.06, 51, 365/63

(56) References Cited

U.S. PATENT DOCUMENTS 5,534,797 * 7/1996 McPartland ...................... 365/230.06
5,602,784 * 2/1997 Kojima et al. ................... 365/230.06

* cited by examiner

Primary Examiner—Trong Phan
(74) Attorney, Agent, or Firm—Skjerven Morrill MacPherson LLP; David T. Millers

(57) ABSTRACT

A row decoder driver in a semiconductor memory device includes a first MOS transistor. The first MOS transistor includes a first source area having a width equal to an integral multiple of a memory cell pitch, and a first drain area having a width equal to the integral multiple of the memory cell pitch. The first drain area is adjacent to the first source area with a first gate area formed between the first source area and the first drain area. The gate area and an underlying channel region extend in a direction perpendicular to the direction of a wordline. First source contacts are in the first source area, and first drain contacts are in the first drain area, facing the first source contacts across the first gate area. This placement of source and drain contacts increases the efficiency of the MOS driver. Therefore, important properties such as tRCD and tRP in a synchronous DRAM are improved, and a standby current in the row decoder driver is reduced.

15 Claims, 5 Drawing Sheets

ROW DECODER DRIVER FOR SEMICONDUCTOR MEMORY DEVICE

BACKGROUND OF THE INVENTION

1. Field of the Invention

The present invention relates to a row decoder for a semiconductor memory device, and more particularly, to a driver of a row decoder having an optimized layout.

2. Description of the Related Art

In semiconductor memory devices, a sense amplifier, a sub-wordline decoder, a column decoder, and a row decoder are laid out in accordance with a cell pitch of a memory array. The row decoder decodes a row address and selects a wordline of a memory cell for application of a voltage required for accessing a memory cell. Accordingly, the row decoder typically includes a decoder portion for decoding a row address and a driver portion for driving the required voltage on the selected wordline.

In the conventional layout of a driver of a row decoder (hereinafter, a row decoder driver), the width of the row decoder driver is an integer multiple of the cell pitch. The layout typically includes a PMOS driver and an NMOS driver associated with each wordline, and the sources/drains and channels of the PMOS and NMOS drivers have widths running in the direction of the wordline. With this layout, the cell pitch is generally insufficient to permit source contacts and drain contacts that face each other on opposite sides of a gate area. Accordingly, the source and drain contacts must be offset from each other in the wordline direction. As a result, the effective area of the driver is much smaller than the laid-out area the driver, and the driver takes longer to enable a wordline. This increases the critical Ras to Cas delay times tRCD and tRP in a synchronous DRAM and reduces the performance characteristics of the synchronous DRAM. Also, the row decoder driver is larger than necessary, so that a standby current and power consumption are correspondingly larger than necessary.

SUMMARY OF THE INVENTION

To solve the above problems, an embodiment of the present invention provides a row decoder driver having an optimized layout that improves the driver's efficiency.

One specific embodiment the present invention provides a row decoder driver having a first MOS driver and a second MOS driver. The first MOS driver includes a first source area having a width equal to an integral multiple of memory cell pitch and a first drain area having a width equal to the memory cell pitch. A first channel region underlies a first gate area and is between the first source area and the first drain area. The first channel region has a channel width extending in a direction perpendicular to the direction of a wordline. First source contacts are in the first source area; and first drain contacts are in the first drain area, facing the first source contacts across the first gate area.

BRIEF DESCRIPTION OF THE DRAWINGS

The aspects and advantages of the present invention will become more apparent by describing an exemplary embodiment thereof with reference to the attached drawings in which.

Use of the same reference symbols in different figures indicates similar or identical items.

DESCRIPTION OF THE PREFERRED EMBODIMENT

Figure 1:
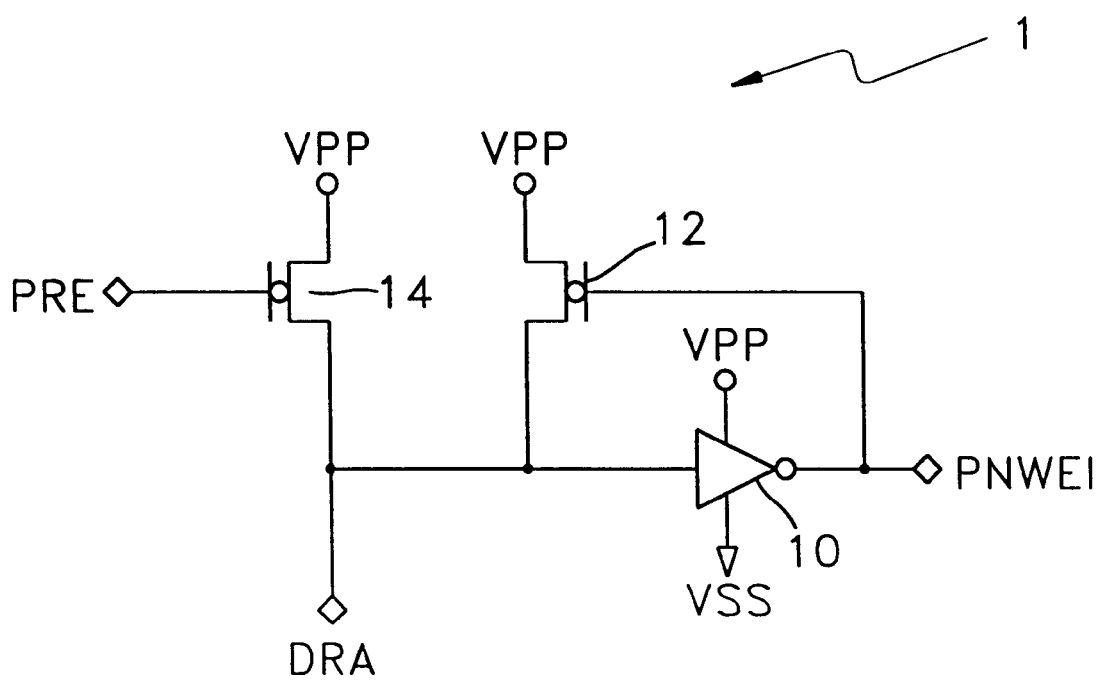
FIG. 1 is a circuit diagram of a row decoder driver.

FIG. 1 shows a row decoder driver 1 that includes an inverter 10, a latch PMOS transistor 12, and a precharge PMOS transistor 14. The inverter 10 swings the signal level of a corresponding wordline PNWEI to the level of a step-up voltage Vpp or a power supply voltage Vss (e.g., ground) in response to a row address decoding signal DRA. For example, when the level of the signal DRA represents a logic "1", the row decoder driver 1 outputs the supply voltage Vss to wordline PNWEI, but when the level of the signal DRA represents a logic "0", the row decoder driver outputs the step-up voltage Vpp to wordline PNWEI. The row decoder driver 1 applies the step-up voltage Vpp to the wordline PNWEI for an access of a memory cell coupled to the wordline PNWEI.

The inverter 10 includes two MOS drivers having complementary characteristics. To be more specific, the inverter 10 includes a PMOS driver and an NMOS driver connected in series between voltages Vpp and Vss. The PMOS driver includes one or more PMOS transistors connected in parallel, and the NMOS driver includes one or more NMOS transistors connected in parallel. The gates of the PMOS and NMOS drivers are coupled to each other, and the signal DRA is applied to the coupled gates. An inverted output signal is from a node between the PMOS and NMOS drivers.

The latch PMOS transistor 12 prevents the gate of the inverter 10 from floating, and in response to a precharge signal PRE, the precharge PMOS transistor 14 precharges the signal DRA at the input port of the inverter 10.

Figure 2:
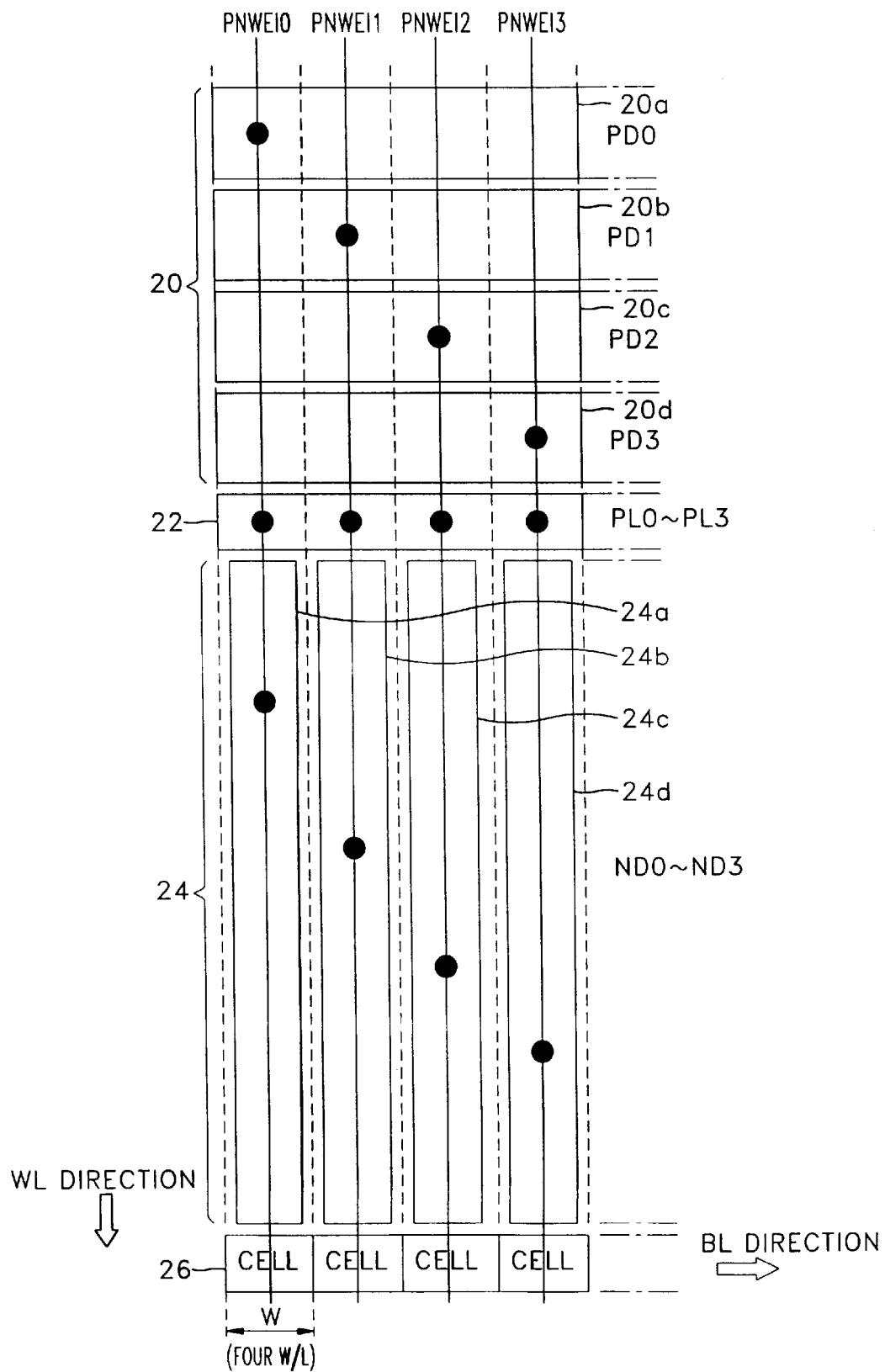
FIG. 2 is a layout of a conventional row decoder driver unit.

FIG. 2 shows a conventional layout of a row decoder driver unit. In FIG. 2, a PMOS driver area 20 contains the PMOS driver of the inverter 10 of FIG. 1. A latch area 22 contains the latch PMOS transistor 12 of FIG. 1. An NMOS driver area 24 contains the NMOS driver of the inverter 10 of FIG. 1, and a cell area 26 contains memory cells of a memory array. The PMOS driver area 20, the latch area 22, the NMOS driver area 24, and the cell area 26 are sequentially arranged along a wordline direction.

FIG. 2 actually shows an example of a unit containing four row decoder drivers for four wordlines PNWEI0 to PNWEI3. Thus, the PMOS and NMOS areas 20 and 24 have four sub-areas 20a through 20d and four sub-areas 24a through 24d for drivers respectively coupled to the first through fourth wordlines PNWEI0 through PNWEI3.

A PMOS driver PD0 formed in the first PMOS driver sub-area 20a and an NMOS driver ND0 formed in the first NMOS driver sub-area 24a are coupled to each other and constitute an inverter corresponding to the inverter 10 of FIG. 1. This inverter provides an output signal to the first wordline PNWEI0. A PMOS driver PD1 in the second PMOS driver sub-area 20b is coupled to an NMOS driver ND1 in the second NMOS driver sub-area 24b. A PMOS driver PD2 in the third PMOS driver sub-area 20c is coupled to an NMOS driver ND2 in the third NMOS driver sub-area 24c, and a PMOS driver PD3 in the fourth PMOS driver sub-area 20d is coupled to an NMOS driver ND3 in the fourth NMOS driver sub-area 24d. The inverters thus created provide respective output signals to the second wordline PNWEI1, the third wordline PNWEI2, and the fourth wordline PNWEI3.

Four latch PMOS transistors PL0 to PL3, which correspond to latch PMOS transistor 12 of FIG. 1, are in the latch area 22.

Four cell areas 26 contain memory cells that respectively couple to the four wordlines PNWEI1 to PNWEI3, and the pitch of each memory cell is W. That is, four wordlines and a total width 4*W are allocated to each driver unit such as illustrated in FIG. 2.

Figure 3:
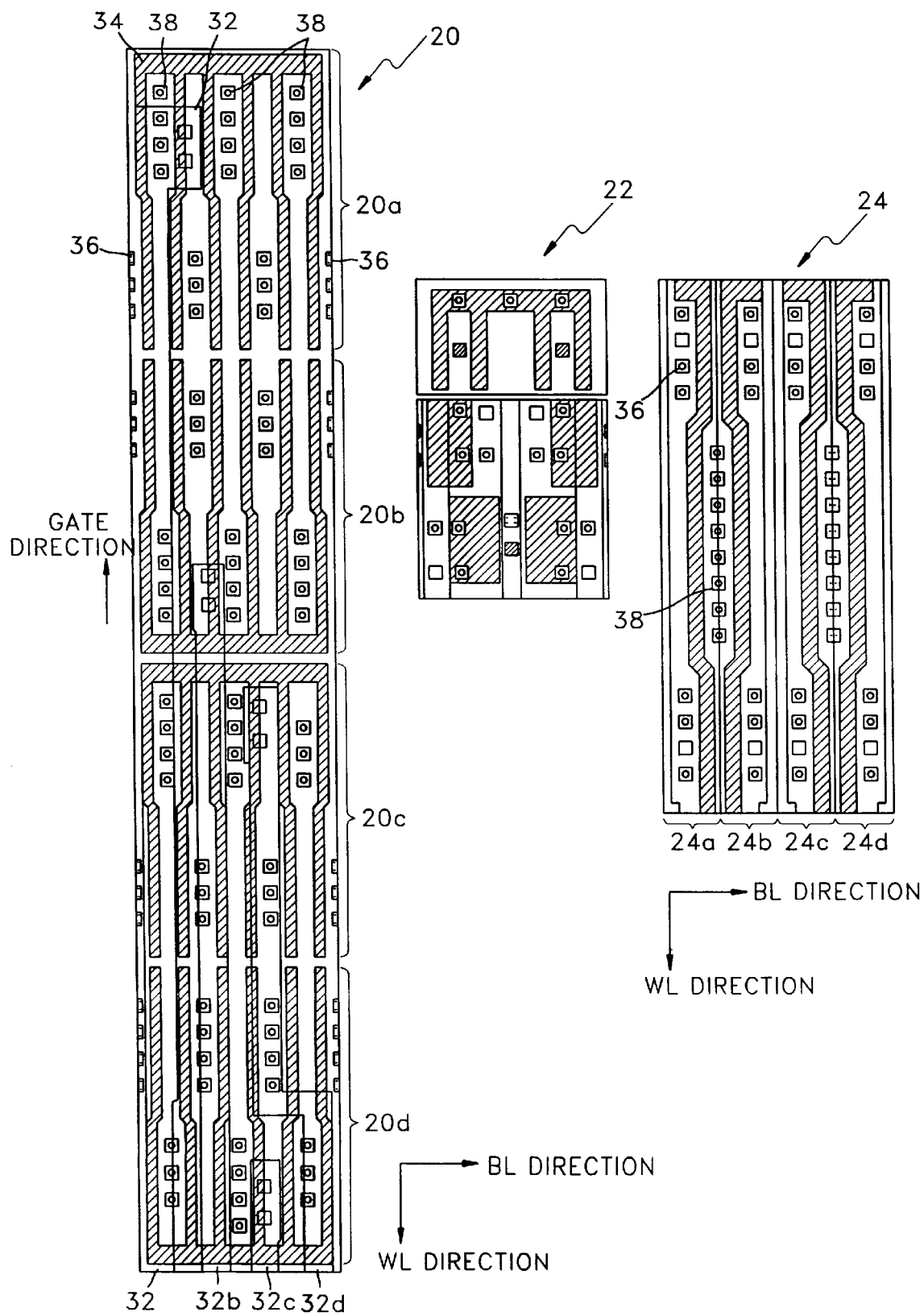
FIG. 3 shows the internal layout of areas in the row decoder driver layout of FIG. 2.

FIG. 3 shows the internal layouts of the PMOS driver area 20, the latch area 22, and the NMOS driver area 24 of FIG. 2. For the following description, a source area (not identified by a reference numeral) is an area where the source and the source contact 36 are formed, and a drain area (not identified by a reference numeral) is an area where the drain and the drain contact 38 are formed.

In the PMOS driver area 20 of FIG. 3, the source areas and drain areas alternate along a bitline (BL) direction. A gate area 34 overlies channel regions that extend in the wordline direction and are between adjacent source and drain areas. The internal layouts of PMOS driver sub-areas 20a through 20d are substantially identical although FIG. 3 only includes reference numbers for the PMOS driver in sub-area 20a. A wordline 32 (e.g., corresponding to the wordline PNWEI0 of FIG. 2) attaches to an output node in sub-area 20a. Similar wordlines 32b, 32c, and 32d attach to output nodes in sub-areas 20b, 20c, and 20d. Source contacts 36, which allow connections to the source areas, and the drain contacts 38, which allow connections to the drain areas, are alternately offset from each other in the WL direction so that they do not face each other across gate area 34. The source contacts 36, the drain contacts 38, and a channel area between them form one PMOS transistor. As shown in FIG. 3, six PMOS transistors in a PMOS driver sub-area 20a, 20b, 20c, or 20d are connected in parallel and constitute one PMOS driver PD0, PD1, PD2, or PD3.

In FIG. 3, a direction in which the gate 34 of the PMOS driver extends over a channel (i.e., the gate direction of FIG. 3) is parallel to the wordline direction. Accordingly, the cell pitch restricts the channel length. Further, the source/drain contacts 36 and 38 are offset from each other in the wordline direction rather than facing each other across the gate area 34. This is because width of the driver unit must accommodate the source and drain areas and the channel lengths of the PMOS transistors, and the source and drain areas are widest where the contacts 36 and 38 are formed. If the source and drain contacts 36 and 38 faced each other, the pitch would not provide a sufficient channel length for the PMOS transistors.

However, this offset in the layout increases the distance between the source contacts 36 and the drain contacts 38, which increases resistance and lowers the efficiency of the PMOS driver. Accordingly, the time required for the PMOS driver to pull up the attached wordline is longer. Also, the area of the PMOS driver is larger than needed, so that a standby current is larger than needed.

Furthermore, to obtain the desired driving capability of the PMOS driver, the PMOS driver must be extended in the wordline direction due to the restriction of the cell pitch. This extension of the PMOS drivers increases the required chip area and restricts the integration of a memory device.

The gate direction of the NMOS driver area 24 of FIG. 3 is also parallel to the wordline direction. For the same reason as in PMOS driver area 20, the source contacts 36 and the drain contacts 38 in the NMOS driver area 24 do not face each other across the gates.

Figure 4:
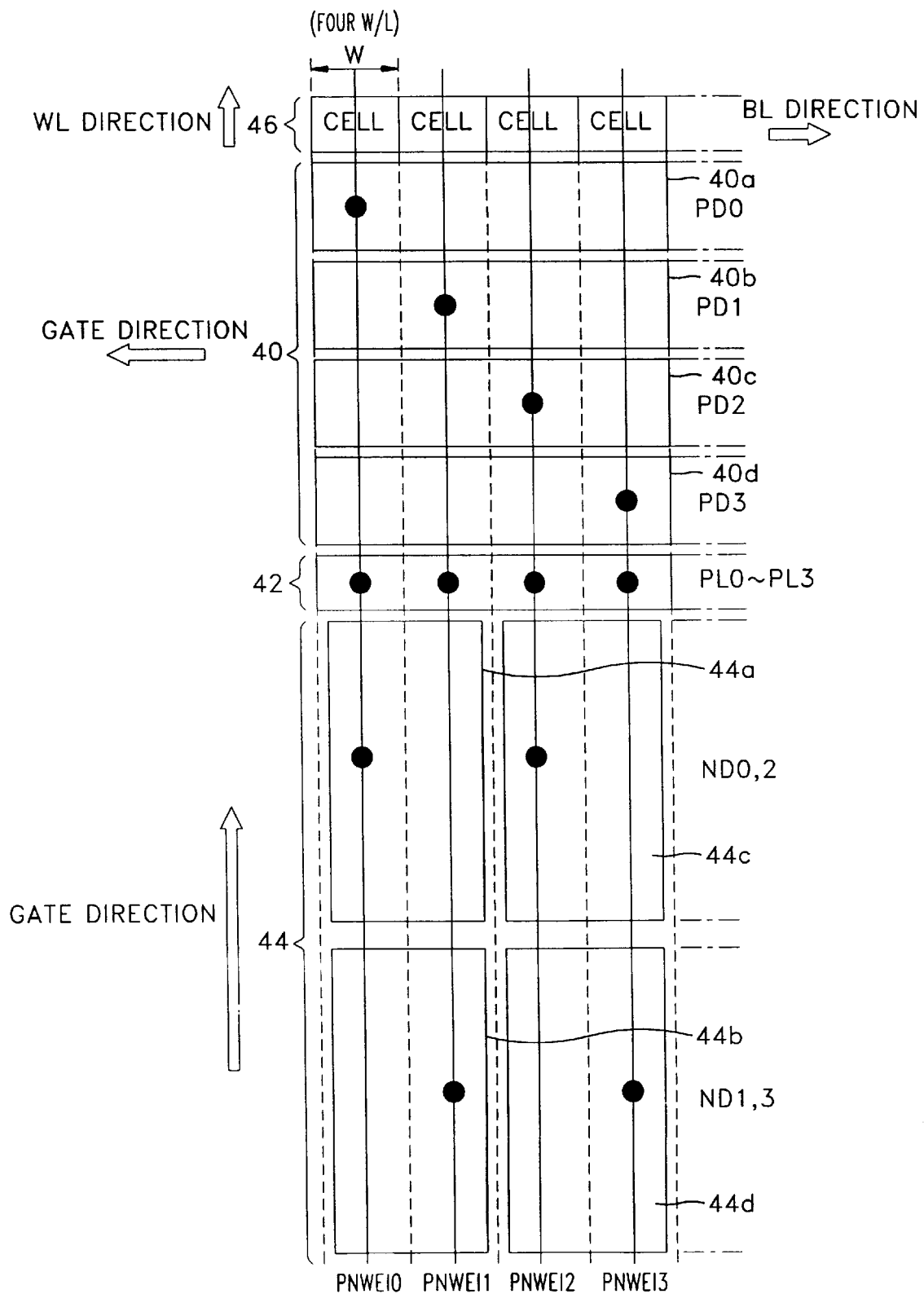
FIG. 4 is a layout of a row decoder driver unit according to the present invention.

FIG. 4 shows a layout of a row decoder driver according to an embodiment of the present invention. In FIG. 4, a PMOS area 40 contains four sub-areas 40a, 40b, 40c, and 40c respectively containing PMOS drivers PD0, PD1, PD2, and PD3 corresponding to the PMOS driver in the inverter 10 of FIG. 1. A latch area 42 contains PMOS transistors corresponding to the latch PMOS transistor 12 of FIG. 1. An NMOS driver area 44 contains four sub-areas 44a, 44b, 44c, and 44d respectively containing NMOS drivers corresponding to the NMOS driver in the inverter 10 of FIG. 1. A cell area 46 contains memory cells, for example, DRAM cells of a synchronous DRAM. The cell area 46, the PMOS driver area 40, the latch area 42, and the NMOS driver area 44 are sequentially arranged in the wordline direction.

The layout according to the present invention shown in FIG. 4 has several differences from the conventional layout of FIG. 2. First, the gate direction in the internal layout of the PMOS driver area 40 is perpendicular to the wordline direction. Second, the layout of the NMOS driver area 44 differs from that of the NMOS driver area 24 in FIG. 2. Third, the relative location of the cell area 46 and the sequential order of areas 40, 42, and 44 differ from those of corresponding areas in FIG. 2.

Figure 5:
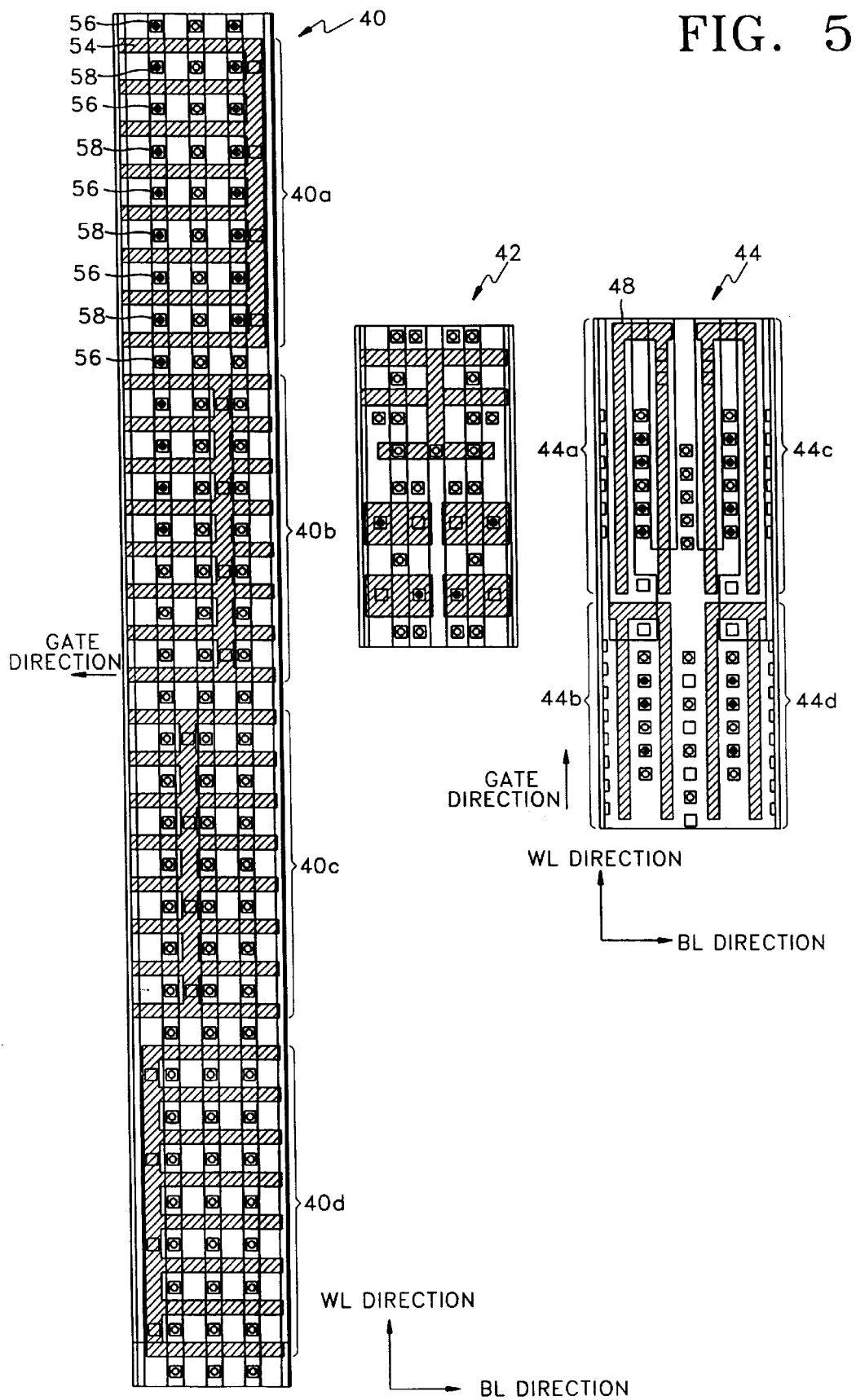
FIG. 5 shows the internal layout of areas in the row decoder driver layout of FIG. 4.

FIG. 5 shows the internal layouts of the PMOS driver area 40, the latch area 42, and the NMOS driver area 44 of FIG. 4.

The PMOS driver area 40 contains four PMOS driver areas 40a to 40d. In PMOS driver areas 40a through 40d, source/drain areas for forming a PMOS driver are alternately arranged along the wordline direction and a gate area 54 overlies channel regions that are between adjacent source and drain areas. FIG. 5 shows that the channel regions under gate 54 extend in the bitline direction, which is perpendicular to the wordline (WL) direction. Accordingly, the cell pitch and the size of the contacts 56 and 58 do not restrict the channel lengths of the PMOS transistors in the PMOS driver. Also, the source contacts 56 and the drain contacts 58 can face each other with the channel area therebetween, such that the efficiency of the PMOS driver is increased.

With this layout, the area of the PMOS driver can be optimized due to the increase in the efficiency of the PMOS driver, and a standby current can be reduced. Therefore, power consumption can be reduced.

The NMOS driver area 44 includes four sub-areas 44a through 44d. Each of sub-area 44a to 44d overlaps two wordlines PNWEI0 and PNWEI1 or PNWEI2 and PNWEI3. With this configuration, the width of each of the NMOS driver sub-areas 44a to 44d is twice the width of each of the NMOS driver sub-areas 24a to 24d of FIG. 3. Accordingly, even when the gate direction is parallel to the wordline direction, source and drain contacts that respectively contact the source and drain areas can face each other with a gate area 48 therebetween. Thus, the efficiency of an NMOS driver is increased.

The cell area 46 (not shown in FIG. 5) is adjacent the PMOS driver area 40 in contrast to the layout of FIG. 3 where the NMOS driver area 24 is adjacent the cell area 26. Having the PMOS driver area adjacent the memory cells reduces current consumption from the step-up voltage Vpp.

In the row decoder driver, source contacts and drain contacts face each other, which increases the efficiency of the driver. Therefore, important properties such as the Ras to Cas delay times tRCD and tRCP of a synchronous DRAM are improved, and a standby current in the row decoder driver is reduced.

Although the invention has been described with reference to a particular embodiment, modifications of the described embodiment may be made without departing from the spirit and scope of the invention.

What is claimed is:

1. A row decoder driver including an inverter that comprises of a first MOS driver and a second MOS driver, wherein the first MOS driver comprises:
   a first source area;
   a first drain area;
   a first gate area formed between the first source area and the first drain area, the first gate area overlying a channel having a channel width extending in a direction perpendicular to a wordline;
   one or more first source contacts formed in the first source area; and
   one or more first drain contacts formed in the first drain area, facing the first source contacts across the first gate area.

2. The row decoder driver of claim 1, wherein said first MOS driver is a PMOS driver.

3. The row decoder driver of claim 1, wherein said second MOS driver is an NMOS driver.

4. The row decoder driver of claim 1, wherein said first MOS driver is adjacent to a cell array.

5. The row decoder driver of claim 1, wherein said first MOS driver occupies an area that is at least twice as wide as a memory cell pitch of a memory array to which the row decoder driver attaches.

6. The row decoder driver of claim 5, wherein said second MOS driver comprises:
   a second source area;
   a second drain area;
   a second gate area between the second source area and the second drain area, the second gate area overlying a channel having a channel width extending in a direction parallel to the wordline
   one or more second source contacts in the second source area; and
   one or more second drain contacts in the second drain area, facing the second source contacts across the second gate area.

7. The decoder driver of claim 6, wherein an area containing the second MOS driver has a width equal to an integer multiple of a memory cell pitch of a memory array to which the row decoder driver attaches.

8. The decoder driver of claim 1, wherein the first source area has a width equal to an integer multiple of a memory cell pitch of a memory array to which the row decoder driver attaches.

9. The decoder driver of claim 1, wherein the first drain area has a width equal to an integer multiple of a memory cell pitch of a memory array to which the row decoder driver attaches.

10. A PMOS driver for a row decoder, comprising:
    a first source area;
    a first drain area;
    a first channel between the first source area and the first drain area, the first channel having a channel width extending in a direction perpendicular to a wordline connected to the PMOS driver; and
    a first gate area overlying the first channel.

11. The driver of claim 10, further comprising:
    a first source contact in the first source area; and
    a first drain contact in the first drain area, facing the first source contact directly across the first gate area.

12. The driver of claim 10, further comprising:
    a second source area;
    a second channel between the second source area and the first drain area, the second channel having a channel width extending in the direction perpendicular to the wordline; and
    a second gate area overlying the second channel.

13. The driver of claim 12, wherein the first and second gate areas are parts of a gate of the PMOS driver.

14. An NMOS driver for a row decoder, comprising:
    a source area;
    a drain area;
    a channel between the source area and the drain area, the channel having a channel width extending in a direction parallel to a wordline connected to the NMOS driver;
    a gate area overlying the channel;
    a source contact contacting the source area; and
    a drain contact contacting the drain area and facing the first source contacts directly across the channel.

15. The NMOS driver of claim 14, wherein the NMOS driver occupies an area having a width equal to at least twice a memory cell pitch of a memory array to which the NMOS driver attaches.

* * * * *